United States Patent
Bartels et al.

(10) Patent No.: US 10,816,603 B1
(45) Date of Patent: Oct. 27, 2020

(54) DETERMINING AVAILABLE BATTERY CURRENT IN A PORTABLE ELECTRONIC DEVICE

(71) Applicant: MOTOROLA SOLUTIONS, INC., Chicago, IL (US)

(72) Inventors: Peter J. Bartels, Loxahatchee, FL (US); Javier Alfaro, Miami, FL (US); Hugo Garcia, Miami Springs, FL (US); George S. Hanna, Miami, FL (US); Liang Xu, Weston, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 23 days.

(21) Appl. No.: 16/384,454

(22) Filed: Apr. 15, 2019

(51) Int. Cl.
*G01R 31/36* (2020.01)
*G01R 31/389* (2019.01)
*H02J 7/00* (2006.01)

(52) U.S. Cl.
CPC ....... *G01R 31/3647* (2019.01); *G01R 31/389* (2019.01); *H02J 7/0063* (2013.01)

(58) Field of Classification Search
CPC .... H02J 7/0063; H02J 7/007; G01R 31/3647; G01R 31/389
(Continued)

(56) References Cited

U.S. PATENT DOCUMENTS 4,551,854 A 11/1985 Rutty et al.
4,637,022 A 1/1987 Burke et al.
(Continued)

FOREIGN PATENT DOCUMENTS

JP 2006148671 6/2006
WO 0011781 3/2000

OTHER PUBLICATIONS

Nagari et al. "An 8 Omega 2.5 W1%-THD 104 dB(A)-Dynamic-Range Class-D Audio Amplifier With Ultra-Low EMI System and Current Sensing for Speaker Protection," IEEE Journal of Solid-State Circuits, IEEE Service Center, Piscataway, NJ, USA, vol. 47, No. 12,1 (Dec. 1, 2012) pp. 3068-3080, XP011485432, ISSN: 0018-9200, DOI: 10.1109/JSSC.2012.2225762, Chapters I and II; abstract; figure 1.

*Primary Examiner* — Tomi Skibinski
(74) *Attorney, Agent, or Firm* — Michael Best & Friedrich LLP

(57) ABSTRACT

Systems and methods for determining available current for a battery in a portable electronic device. One method includes, in response to determining that a received current level of an auxiliary supply rail is equal to or below a predetermined threshold, acquiring a plurality of unloaded voltages for the battery and calculating an unloaded voltage based on the unloaded voltages. The method includes activating a switchable load coupled between the battery and ground, acquiring a plurality of loaded voltages for the battery, and calculating a loaded voltage based on the loaded voltages. The method includes calculating an impedance for the battery based on the unloaded and loaded voltages and an impedance for the switchable load. The method includes determining a current budget based on the impedance, a minimum operating voltage, and a maximum allowable current draw, and adjusting an operating parameter of the portable electronic device based on the current budget.

23 Claims, 9 Drawing Sheets

(58) Field of Classification Search
USPC .................................. 307/130, 131; 320/136
See application file for complete search history.

(56) References Cited

U.S. PATENT DOCUMENTS

| | | | |
|---|---|---|---|
| 4,684,870 | A | 8/1987 | George et al. |
| 5,263,092 | A | 11/1993 | Jang |
| 6,809,504 | B2 | 10/2004 | Tang et al. |
| 6,853,242 | B2 | 2/2005 | Melanson et al. |
| 7,046,755 | B2 | 6/2006 | Dupuis et al. |
| 7,550,975 | B2 | 6/2009 | Honda et al. |
| 7,697,704 | B2 | 4/2010 | Brooks et al. |
| 7,782,018 | B2 | 8/2010 | Voigt |
| 8,295,950 | B1 | 10/2012 | Wordsworth et al. |
| 8,619,653 | B2 | 12/2013 | Ji et al. |
| 8,676,273 | B1 | 3/2014 | Fujisaki |
| 8,843,774 | B2 | 9/2014 | Chen et al. |
| 9,075,090 | B2 | 7/2015 | Zimmerman et al. |
| 9,131,452 | B2 | 9/2015 | Bartels et al. |
| 9,281,704 | B2 | 3/2016 | Heo et al. |
| 9,374,787 | B2 | 6/2016 | Delind Van Wijngaarden et al. |
| 9,472,967 | B2 | 10/2016 | Nunez et al. |
| 9,774,966 | B1 | 9/2017 | Budny et al. |
| 9,892,691 | B1 | 2/2018 | Lim et al. |
| 9,955,429 | B2 | 4/2018 | Perakamppi et al. |
| 2006/0247920 | A1 | 11/2006 | Toriyama |
| 2007/0244587 | A1 | 10/2007 | Yamamoto |
| 2008/0016070 | A1 | 1/2008 | Ogawa et al. |
| 2012/0083902 | A1 | 4/2012 | Daum et al. |
| 2012/0101640 | A1 | 4/2012 | Stapelfeldt |
| 2012/0310565 | A1* | 12/2012 | Redey .................. G01R 31/367 702/63 |
| 2014/0169796 | A1 | 6/2014 | Sasaki et al. |
| 2016/0036260 | A1* | 2/2016 | Nunez .................. H02J 7/0047 320/136 |

\* cited by examiner

Table 400 — With Comparator Window

| Settings | | DMM Run1 | DMM Run2 | EVB Run1 | EVB Run2 | EVB Run3 | DMM Run1 | DMM Run2 | EVB Run1 | EVB Run2 | EVB Run3 |
|---|---|---|---|---|---|---|---|---|---|---|---|
| Averaging Mode | 16 | | | | | | | | | | |
| Bus Conversion | 588 | Expected (Ω) | | | 0.135 | | | | | 0.400 | | |
| Display | On (50%) | Rload (Ω) | 22 | 22 | 22 | 22 | 22 | 22 | 22 | 22 | 22 | 22 |
| AP | Idle | V_Idle (V) | 7.456 | | 7.460 | 7.458 | 7.459 | | | 7.379 | 7.378 | 7.380 |
| GPS | On (QMMI) | V_Loaded (V) | 7.410 | | 7.413 | 7.413 | 7.413 | | | 7.245 | 7.248 | 7.244 |
| BT | On (Connected) | Rbat (Ω) | 0.137 | | 0.139 | 0.134 | 0.137 | | | 0.407 | 0.395 | 0.413 |
| | | Error | 1% | | 3% | -1% | 1% | | | 2% | -1% | 3% |

Table 402 — NO Comparator Window

| Settings | | DMM Run1 | DMM Run2 | EVB Run1 | EVB Run2 | EVB Run3 | DMM Run1 | DMM Run2 | EVB Run1 | EVB Run2 | EVB Run3 |
|---|---|---|---|---|---|---|---|---|---|---|---|
| Averaging Mode | 16 | | | | | | | | | | |
| Bus Conversion | 588 | Expected (Ω) | | | 0.135 | | | | | 0.400 | | |
| Display | On (50%) | Rload (Ω) | 22 | 22 | 22 | 22 | 22 | 22 | 22 | 22 | 22 | 22 |
| AP | 6 CORE MAXED OUT | V_Idle (V) | 5.966 | 5.948 | 5.959 | 5.950 | 5.974 | 7.035 | 7.133 | 7.041 | 7.128 | 7.201 |
| GPS | On | V_Loaded (V) | 5.937 | 5.929 | 5.942 | 5.925 | 5.945 | 6.957 | 7.017 | 6.942 | 7.014 | 7.054 |
| BT | On (Connected) | Rbat (Ω) | 0.107 | 0.071 | 0.063 | 0.093 | 0.107 | 0.247 | 0.364 | 0.314 | 0.358 | 0.458 |
| | | Error | -20% | -48% | -53% | -31% | -21% | -38% | -9% | -22% | -11% | 15% |

FIG. 4

DETERMINING AVAILABLE BATTERY CURRENT IN A PORTABLE ELECTRONIC DEVICE

BACKGROUND OF THE INVENTION

Portable electronic devices, for example, two-way radios, cellular telephones, and converged devices, are powered by batteries. A battery is able to power a portable electronic device for a limited time before it must be replaced or recharged. The battery's remaining power determines for how long and in what ways a device is able to operate. As a consequence, the control systems of portable devices are sometimes designed to monitor the battery to determine its remaining power. As the battery's power is drawn down or replaced, its power level is reported to a user of the device. The battery's power level may also be used by the control systems to determine what features of the device are available for use (for example, based on those features' power requirements), whether to shut down the device to prevent adverse effects caused by a low battery, and the like.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIG. 4 is a chart illustrating voltage measurements taken using the method of FIGS. 2A and 2B, in accordance with some embodiments.

Figure 1:
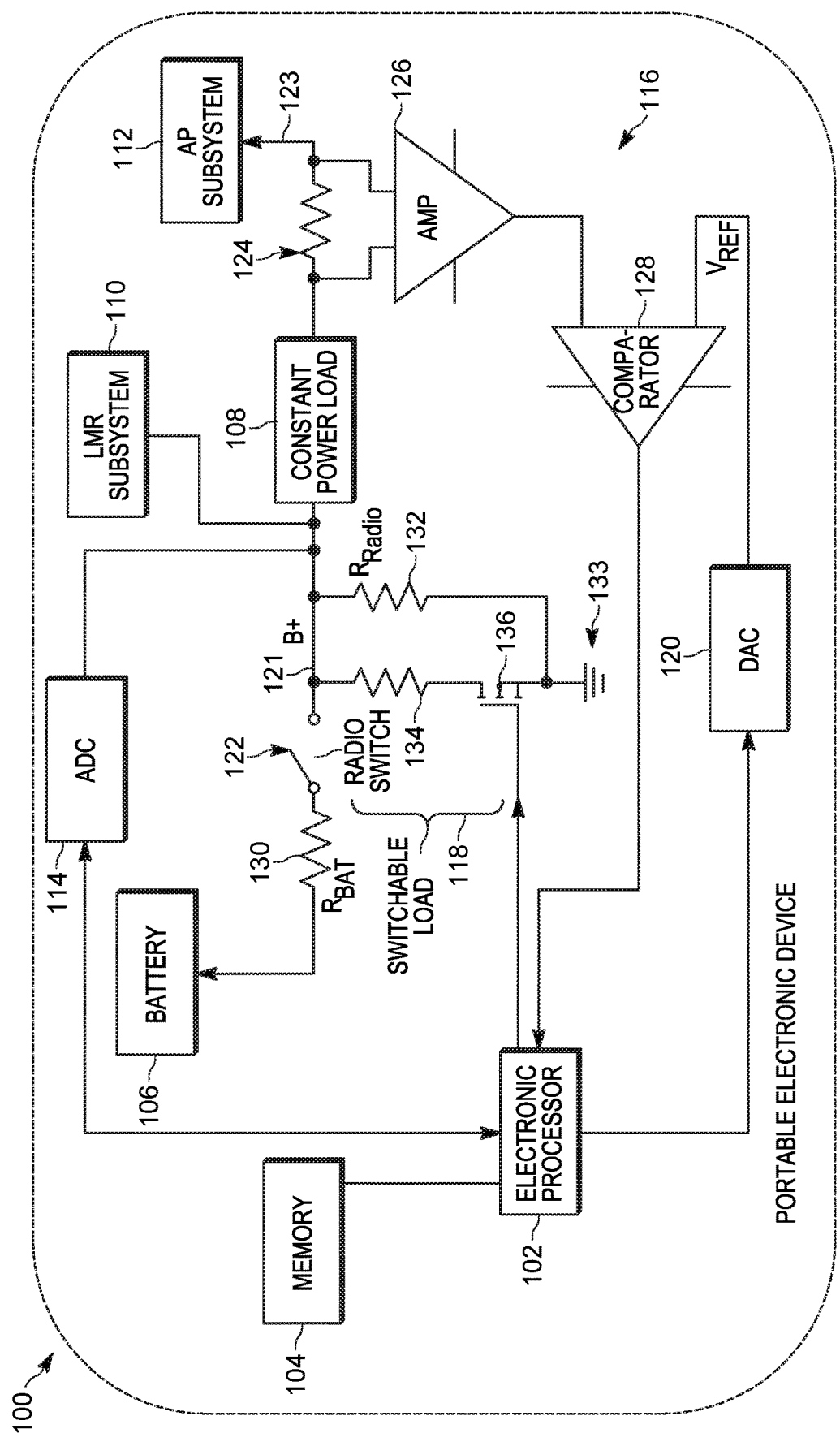
FIG. 1 is a schematic diagram of a portable electronic device, in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

A portable electronic device with multiple systems, for example, a converged device having both land mobile radio and cellular systems, operates using multiple modems and processors. The device monitors its battery's power level. The device's control systems measure the battery's voltage, and calculate an available current for the battery using the voltage measurements. However, as the device operates, the modems, processors, and other electronic components of the device operate to draw current from the battery at various times. For example, a microprocessor and camera may operate to record and process a video stream, a short-range wireless modem may exchange data transmissions with an access point, or an LTE modem may place a cellular telephone call. Some of these components draw enough current while operating to cause a "voltage slump" in the battery. A voltage slump is a temporarily low voltage condition in the battery that does not reflect the true condition of the battery.

A voltage measurement taken during a voltage slump provides an incorrect voltage for the battery. Incorrect voltage measurements lead to false available battery current estimates that are artificially low. In turn, the device may take unnecessary actions to reduce power usage based on an inaccurate available battery current estimate. For example, the device may inhibit or abort certain functions to preserve battery power or prevent adverse effects caused by attempting to operate the device with a low battery. The device may report premature low battery indications, or inconsistent power readings, prompting device users to become dissatisfied with what they perceive to be an inconsistent or insufficient battery life.

Current methods are unable to consistently accommodate for voltage slumps when estimating available battery current. For example, because inter-processor communications are too slow, it is difficult for a master processor to instantaneously know the operating state for all other components. In addition, waiting for components to finish high-current operations or taking repeated measurements delays updating the battery status. Delays in updating battery status degrade the user experience. Directly measuring current with a resistor can shorten battery life and introduces parasitic resistances, which further impact the measurements. Finally, coulomb counters require multiple measurements, which could miss current spikes and delay status updates. Accordingly, embodiments presented herein provide, among other things, systems and methods for determining available current for a battery in a portable electronic device.

One example embodiment provides a system for determining available current for a battery in a portable electronic device. The system includes an auxiliary supply rail coupled to the battery, a switchable load coupled between the battery and a ground, a current sensor configured to sense a current level of the auxiliary supply rail, a voltage sensor configured to measure a voltage of the battery, and an electronic processor coupled to the switchable load, the current sensor, and the voltage sensor. The electronic processor is configured to receive, from the current sensor, the current level. The electronic processor is configured to, in response to determining that the received current level is equal to or below a predetermined threshold, acquire, from the voltage sensor, a plurality of unloaded voltage measurements for the battery. The electronic processor is configured to calculate, based on the plurality of unloaded voltage measurements, an unloaded voltage. The electronic processor is configured to activate the switchable load. The electronic processor is configured to acquire, from the voltage sensor, a plurality of loaded voltage measurements for the battery. The electronic processor is configured to calculate, based on the plurality of loaded voltage measurements, a loaded voltage. The electronic processor is configured to calculate an impedance for the battery based on the unloaded voltage, the loaded voltage, and an impedance for the switchable load. The electronic processor is configured to determine a current budget for the battery based on the impedance, a minimum operating voltage, and a maximum allowable current draw from the battery. The electronic processor is configured to adjust an operating parameter of the portable electronic device based on the current budget.

Another example embodiment provides a method for determining available current for a battery in a portable electronic device. The method includes receiving, from a current sensor, a current level of an auxiliary supply rail. The method includes, in response to determining that the received current level is equal to or below a predetermined threshold, acquiring, from a voltage sensor configured to measure a voltage of the battery, a plurality of unloaded voltage measurements for the battery. The method includes calculating, with an electronic processor, an unloaded voltage based on the plurality of unloaded voltage measurements. The method includes activating, with the electronic processor, a switchable load coupled between the battery and a ground. The method includes acquiring, from the voltage sensor, a plurality of loaded voltage measurements for the battery. The method includes calculating, with the electronic processor, a loaded voltage based on the plurality of loaded voltage measurements. The method includes calculating, with the electronic processor, an impedance for the battery based on the unloaded voltage, the loaded voltage, and an impedance for the switchable load. The method includes determining a current budget for the battery based on the impedance, a minimum operating voltage, and a maximum allowable current draw from the battery. The method includes adjusting an operating parameter of the portable electronic device based on the current budget.

Another example embodiment provides a system for determining available current for a battery in a portable electronic device. The system includes an auxiliary supply rail coupled to the battery, a switchable load coupled between the battery and a ground, a current sensor configured to sense a current level of the auxiliary supply rail, a voltage sensor configured to measure a voltage of the battery, and an electronic processor coupled to the switchable load, the current sensor, and the voltage sensor. The electronic processor is configured to receive, from the current sensor, the current level. The electronic processor is configured to, in response to determining that the received current level is equal to or below a predetermined threshold and in response to determining that an unloaded voltage interval timer has expired, acquire, from the voltage sensor, a unloaded voltage measurement for the battery. The electronic processor is configured to determine a maximum unloaded voltage measurement for the battery based on the unloaded voltage measurement and a plurality of unloaded voltage measurements. The electronic processor is configured to, in response to determining that a high current event delay timer and a loaded voltage interval timer have expired, activate the switchable load and begin a switchable load activation timer. The electronic processor is configured to, in response to determining that the switchable load activation timer has expired, acquire, from the voltage sensor, a loaded voltage measurement for the battery. The electronic processor is configured to calculate an impedance for the battery based on the unloaded voltage, the loaded voltage, and an impedance for the switchable load. The electronic processor is configured to determine a current budget for the battery based on the impedance, a minimum operating voltage, and a maximum allowable current draw from the battery. The electronic processor is configured to adjust an operating parameter of the portable electronic device based on the current budget.

Another example embodiment provides a method for determining available current for a battery in a portable electronic device. The method includes receiving from a current sensor, a current level of an auxiliary supply rail. The method includes, in response to determining that the received current level is equal to or below a predetermined threshold and in response to determining that an unloaded voltage interval timer has expired, acquiring, from a voltage sensor configured to measure a voltage of the battery, a unloaded voltage measurement for the battery. The method includes determining a maximum unloaded voltage measurement for the battery based on the unloaded voltage measurement and a plurality of unloaded voltage measurements. The method includes, in response to determining that a high current event delay timer and a loaded voltage interval timer have expired, activating a switchable load coupled between the battery and a ground and beginning a switchable load activation timer. The method includes, in response to determining that the switchable load activation timer has expired, acquiring, from the voltage sensor, a loaded voltage measurement for the battery. The method includes calculating an impedance for the battery based on the unloaded voltage, the loaded voltage, and an impedance for the switchable load. The method includes determining a current budget for the battery based on the impedance, a minimum operating voltage, and a maximum allowable current draw from the battery. The method includes adjusting an operating parameter of the portable electronic device based on the current budget.

For ease of description, some or all of the example systems presented herein are illustrated with a single exemplar of each of its component parts. Some examples may not describe or illustrate all components of the systems. Other example embodiments may include more or fewer of each of the illustrated components, may combine some components, or may include additional or alternative components.

FIG. 1 is a diagram of an example portable electronic device 100. As illustrated in FIG. 1, the example portable electronic device 100 is a converged device, which incorporates hardware and software elements of a smart telephone and a portable two-way radio, as described herein. In other embodiments, the portable electronic device 100 may be another type of portable or mobile electronic device containing software and hardware enabling it to operate as described herein.

In the embodiment illustrated, the portable electronic device 100 includes an electronic processor 102, a memory 104, a battery 106, a constant power load 108, a land mobile radio (LMR) subsystem 110, an application processing (AP) subsystem 112, a voltage sensor 114, a current sensor 116, a switchable load 118, and a digital-to-analog converter 120. The illustrated components of FIG. 1, along with other various modules and components are coupled to each other by or through one or more control or data buses that enable communication therebetween. The use of control and data buses for the interconnection between and exchange of information among the various modules and components would be apparent to a person skilled in the art in view of the description provided herein. The portable electronic device 100 may include various digital and analog components, which for brevity are not described herein and which may be implemented in hardware, software, or a combination of both.

The electronic processor 102 obtains and provides information (for example, to and from the memory 104, the voltage sensor 114, the current sensor 116, and the digital-to-analog converter 120). The electronic processor 102 processes the information by executing one or more software instructions or modules, capable of being stored, for example, in a random access memory ("RAM") area of the memory 104 or a read only memory ("ROM") of the memory 104 or another non-transitory computer readable medium (not shown). The software can include firmware, one or more applications, program data, filters, rules, one or more program modules, and other executable instructions. The electronic processor 102 is configured to retrieve from the memory 104 and execute, among other things, software related to the control processes and methods described herein.

The battery 106 includes one or more battery cells (not shown) for providing power to the portable electronic device 100, including to the land mobile radio (LMR) subsystem 110 (for example, via a main supply rail 121) and the application processing (AP) subsystem 112 (for example, via an auxiliary supply rail 123). In some embodiments, the battery 106 is a rechargeable lithium ion battery. The battery 106 can be connected or disconnected from the power rails of the portable electronic device 100 using a radio switch 122. As illustrated in FIG. 1, the battery 106 provides power to the application processing subsystem 112 via the constant power load 108 and the auxiliary supply rail 123. In some embodiments, the constant power load 108 is a DC-to-DC buck regulator. The constant power load 108 energizes the auxiliary supply rail 123, which is coupled to the application processing subsystem 112.

The land mobile radio subsystem 110 includes electronic components (not shown) for transmitting and receiving land mobile radio signals (for example, transceivers, amplifiers, filters, oscillators, baseband processors, and the like). A land mobile radio system is a communication system that provides mission critical functionality, for example push-to-talk functionality, high audio functionality, and other high current inducing functionality, for public safety communications. Such systems may operate in the range of 136-870 Mhz and may generate high radiated power (for example, in the range of 1.5-6.5 watts), depending on the frequency band of operation.

In some embodiments, the application processing subsystem 112 includes electronic components (not shown) for providing smart telephone functionality to users of the portable electronic device 100. In some embodiments, the application processing subsystem 112 includes hardware and software for transmitting and receiving cellular (for example, long term evolution (LTE)) radio signals, short-range wireless signals (for example, Bluetooth™, Wi-Fi™, NFC, and the like). The application processing subsystem 112 also includes one or more processors for executing operating systems, applications, digital signal processing, and other computing or communications functions.

As described in more detail below, the electronic processor 102, is able to determine the available current for the battery 106 using, among other variables, voltage measurements received from the voltage sensor 114. In some embodiments, the voltage sensor 114 is an analog-to-digital converter, which converts the analog voltage for the battery (B+, measured from the main battery supply rail 121) into a digital value that represents the magnitude of the voltage.

The land mobile radio subsystem 110 typically operates to provide half-duplex communications (that is, it is either transmitting or receiving). As a consequence, the effect of the land mobile radio subsystem 110 on the voltage of the battery 106 is predictable. However, the application processing subsystem 112 performs multiple functions simultaneously. The various transmitters and other electronic components draw electric current at varying levels from the battery 106, which can generate voltage slumps in an unpredictable way. As described in more detail below, in some embodiments, the electronic processor 102 is configured to take into account the voltage slumps caused by the application processing subsystem 112 when measuring the voltage of the battery 106.

Because voltage slumps are caused by increased current draw, the electronic processor 102 uses the current sensor 116 to sense the current being drawn by the application processing subsystem 112. The current sensor 116 includes a current sensing resistor 124, an amplifier 126, and a comparator 128. The current sensing resistor 124 is coupled in series with the auxiliary supply rail 123. As current is drawn through the auxiliary supply rail 123, it causes a voltage drop across the current sensing resistor 124. The amplifier 126 is coupled to the current sensing resistor and the comparator 128. The amplifier 126 outputs a voltage proportional to the voltage drop across the current sensing resistor 124. In some embodiments, the amplifier 126 is an instrumentation amplifier. The comparator 128 receives the output from the amplifier 126, and compares it to a reference voltage provided by the digital-to-analog converter 120. The electronic processor 102 digitally controls the digital-to-analog converter 120 to provide an analog reference voltage to the comparator 128. In some embodiments, the reference voltage (for example, 80 millivolts) is determined based on the idle current draw of the application processing subsystem 112 and how much error is acceptable. The higher the reference voltage value, the higher the current draw of the application processing subsystem 112 can be before tripping the comparator 128.

The comparator 128 is an analog comparator configured to output a low signal (for example, near zero volts) when the output from the amplifier 126 is at or below the reference voltage, and to output a high signal (for example, 5 volts) when the output from the amplifier 126 exceeds the reference voltage.

As described in detail below, the electronic processor 102, is able to determine the available current for the battery 106 using, among other variables, the impedance for the battery ($R_{Bat}$). For ease of explanation, the impedance 130 for the battery 106 is represented conceptually in FIG. 1. Likewise, the radio load 132 ($R_{Radio}$), which represents the current drawn by the portable communication device 100, is also represented conceptually in FIG. 1. As described in detail below, the electronic processor 102, also uses a loaded voltage for the battery 106 to determine the available current for the battery 106. The loaded voltage is measured by pulling the battery 106 to ground 133 using the switchable load 118. The switchable load 118 includes a load power resistor 134 and a switch 136. In the example illustrated in FIG. 1, the switch 136 is a field-effect transistor. The electronic processor 102 uses the switchable load 118 to intentionally change the battery 106 loading by a known fixed amount. The electronic processor 102 activates the switchable load 118 by applying a gate voltage to the field-effect transistor, causing the field-effect transistor to couple the battery 106 to ground 133 via the load power resistor 134. In other embodiments, the switch 136 may be any suitable electronic switch. In some embodiments, the load power resistor 134 is a 24 ohm resistor. The value is dependent on the load resister power specifications and the characteristics of the battery. The longer the switchable load 118 is on, the higher the value has to be in order to meet the power specifications. The higher the power rating of the load power resistor 134, the lower its resistance value can be. The resistance of the load power resistor 134 affects the current drawn when taking a loaded voltage measurement, as described herein. Accordingly, a lower resistance value improves battery life.

Figure 2A:
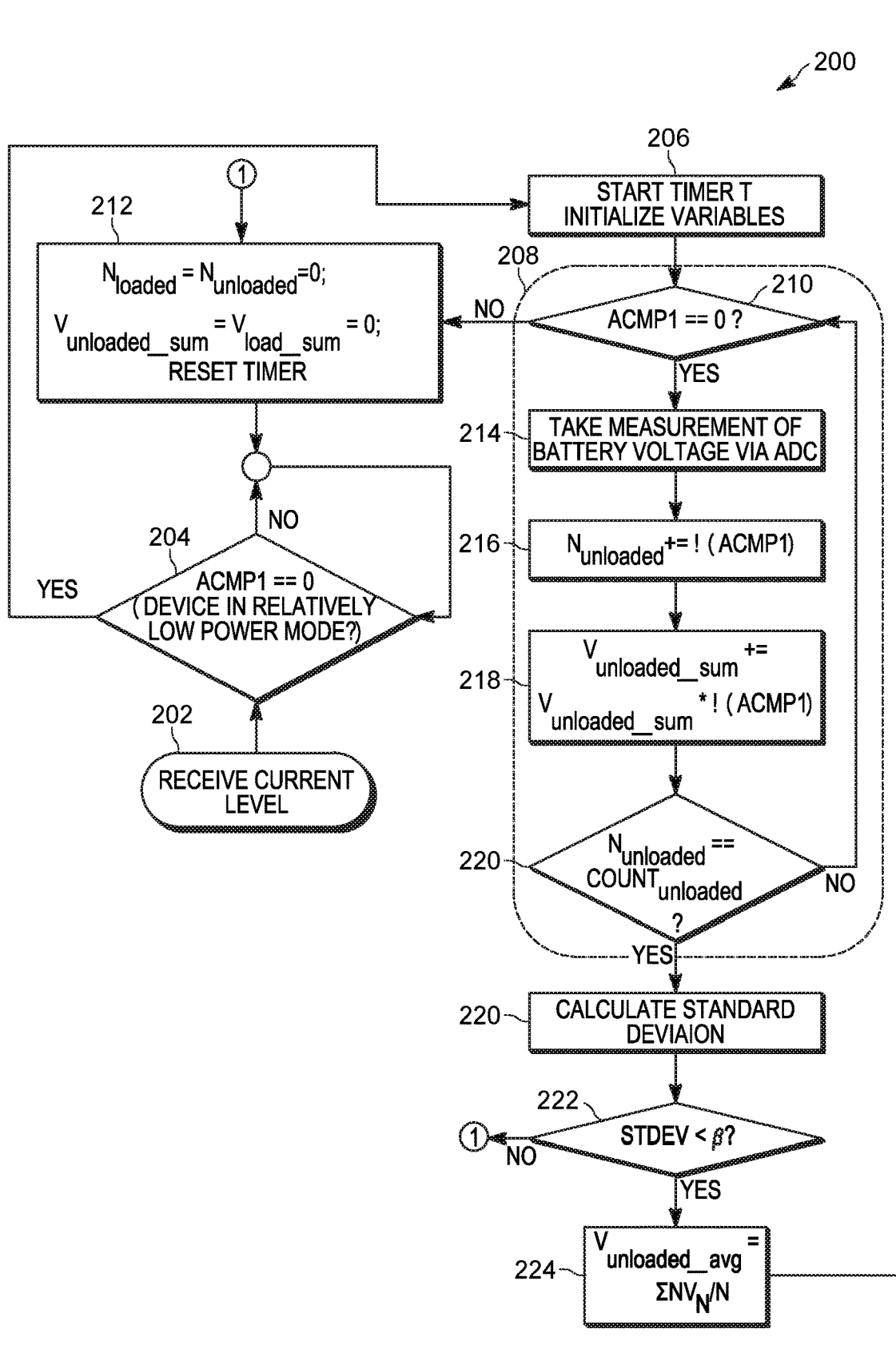
FIGS. 2A-2B illustrate a flowchart of a method for determining available current for a battery in the portable electronic device of FIG. 1, in accordance with some embodiments.
Figure 2B:
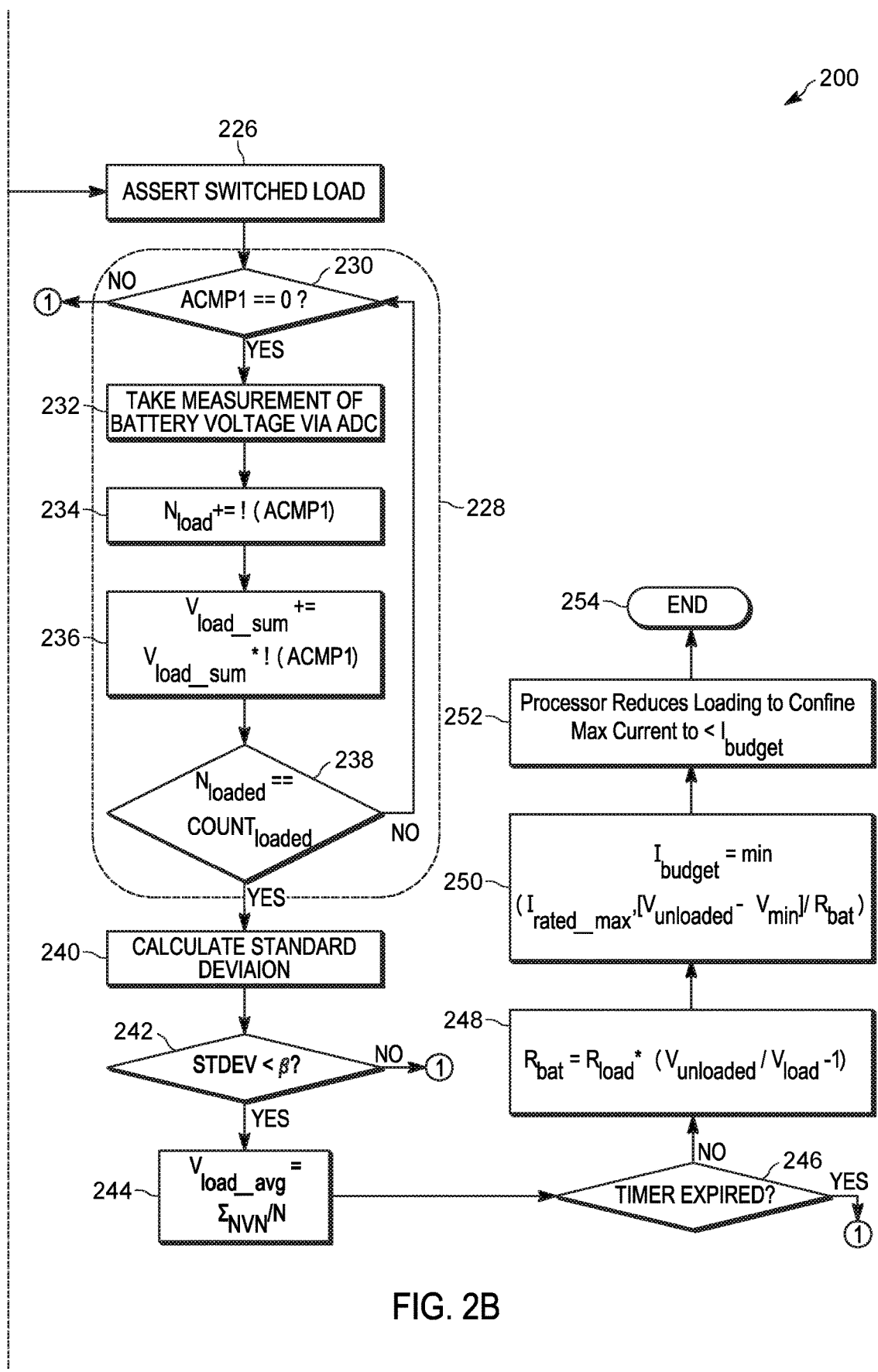

FIGS. 2A and 2B illustrate an example method 200 for determining available current for a battery 106. As an example, the method 200 is described as being performed by the portable electronic device 100 and, in particular, the electronic processor 102.

At block 202, the electronic processor 102 receives, from the current sensor 116, a current level for the auxiliary supply rail 123. In some embodiments, the current level is a current level signal provided by the comparator 128. For example, the electronic processor 102 receives a low current level signal when the amplified voltage is equal to or below the reference voltage, and a high current level signal when the amplified voltage is less than the reference voltage. The current level signal is represented as ACMP1 in FIGS. 2A and 2B. As noted above, ACMP1 is the output signal of the comparator 128 comparing a voltage proportional to the current in the application processing subsystem 112 to a reference voltage provided by the electronic processor 102 via the digital-to-analog converter 120.

In some embodiments, in response to determining that the received current level is equal to or below a predetermined threshold (at block 204), the electronic processor initializes (at block 206) variables, including an unloaded voltage counter ($N_{unloaded}$), a loaded voltage counter ($N_{loaded}$), an unloaded voltage sum ($V_{unloaded\_sum}$), and a loaded voltage sum ($V_{load\_sum}$). The unloaded voltage counter tracks how many unloaded voltage measurements have been taken. The loaded voltage counter tracks how many loaded voltage measurements have been taken. The unloaded voltage sum is the sum of the unloaded voltage measurements. The loaded voltage sum is the sum of the loaded voltage measurements. The electronic processor 102 also starts a timer T to track the passage of time while the method 200 is performed.

At block 208, the electronic processor 102 acquires, from the voltage sensor 114, a plurality of unloaded voltage measurements for the battery 106. For example, at block 210, the electronic processor 102 determines whether the current level is below the predetermined threshold (whether ACMP1 is low). When the current level is below the predetermined threshold, at block 214, the electronic processor 102 takes an unloaded voltage measurement (at block 214), increments the unloaded voltage counter (at block 216), and adds the unloaded voltage measurement to the unloaded voltage sum (at block 218). When the current level is above the predetermined threshold, the electronic processor 102 discards the unloaded voltage measurement. At block 220, the electronic processor 102 compares the unloaded voltage measurement count ($N_{unloaded}$) to a desired quantity of measurements (count$_{unloaded}$). As illustrated in FIGS. 2A and 2B, the electronic processor 102 continues taking measurements until the unloaded voltage counter is equal to a desired quantity (at blocks 210-220).

In some embodiments, when the unloaded voltage measurement count is equal to the desired quantity, at block 220, the electronic processor 102 determines a standard deviation for the plurality of unloaded voltage measurements. At block 222, when the standard deviation exceeds a threshold, the electronic processor 102 discards the plurality of unloaded voltage measurements (at block 212).

At block 224, the electronic processor 102 calculates, based on the plurality of unloaded voltage measurements, an unloaded voltage. In some embodiments, the unloaded voltage is the average of the plurality of unloaded voltage measurements ($V_{unloaded\_avg}$). For example, $V_{unloaded\_avg} = \Sigma_N V_N / N$, where N is the unloaded voltage measurement count for the plurality of unloaded voltage measurements.

At block 226, the electronic processor 102 activates the switchable load 118, for example, by applying a gate voltage to a field effect transistor.

At block 228, the electronic processor 102 acquires, from the voltage sensor 114, a plurality of loaded voltage measurements for the battery 106. For example, at block 230, the electronic processor 102 determines whether the current level is below the predetermined threshold for example, (whether ACMP1 is low). When the current level is below the predetermined threshold, at block 232, the electronic processor 102 takes a loaded voltage measurement (at block 232), increments the loaded voltage counter (at block 234), and adds the loaded voltage measurement to the loaded voltage sum (at block 236). When the current level is above the predetermined threshold, the electronic processor 102 discards the loaded voltage measurement. At block 220, the electronic processor 102 compares the loaded voltage measurement count ($N_{loaded}$) to a desired quantity of measurements (count$_{loaded}$). As illustrated in FIGS. 2A and 2B, the electronic processor 102 continues taking measurements until the loaded voltage counter is equal to a desired quantity (at blocks 230-238).

In some embodiments, the desired quantity (for both loaded and unloaded voltage measurements) is six. The higher the quantity of data points, the longer it takes to take the measurements and the more likely it is that the measurements may be interrupted by the comparator due to a current spike in the application processing subsystem 112. In some embodiments, the desired quantity of measurements is determined by balancing between getting a good average for more consistent results and not taking so long that it decreases the number of times that a clean measurement may be obtained.

In some embodiments, when the loaded voltage measurement count is equal to the desired quantity, at block 240, the electronic processor 102 determines a standard deviation for the plurality of loaded voltage measurements. At block 242, when the standard deviation exceeds a threshold, the electronic processor 102 discards the plurality of loaded voltage measurements (at block 212).

At block 244, the electronic processor 102 calculates, based on the plurality of loaded voltage measurements, a loaded voltage. In some embodiments, the loaded voltage is the average of the plurality of loaded voltage measurements ($V_{loaded\_avg}$). For example, $V_{loaded\_avg} = \Sigma_N V_N / N$, where N is the loaded voltage measurement count for the plurality of loaded voltage measurements.

In some embodiments, at block 246, the electronic processor 102 determines whether a time period between calculating the unloaded voltage and calculating the loaded voltage exceeds a correlation threshold (for example, five seconds). For example, in some embodiments, the timer T is a countdown timer and the electronic processor 102 determines that the time period exceeds the correlation threshold when the timer T expires. In another example, the timer T is a count up timer, and the electronic processor 102 determines whether the time period exceeds the correlation threshold by comparing the elapsed time to the correlation threshold. When the time period exceeds the correlation threshold, the loaded and unloaded voltages have been taken too far apart to provide an accurate estimate of available current. As a consequence, the electronic processor 102 discards the unloaded voltage and the loaded voltage (at block 212). In some embodiments, the correlation threshold is based on the rate of current draw of the portable electronic device 100 and the rate of voltage drop of the battery due to this current draw. The higher the current draw or rate of voltage drop, the lower the correlation threshold should be.

At block 248, the electronic processor 102 calculates an impedance for the battery 106 ($R_{bat}$) based on the unloaded voltage ($V_{unloaded}$), the loaded voltage ($V_{load}$), and an impedance for the switchable load ($R_{load}$) using the following equation:

$$R_{bat}=R_{load}*(V_{unloaded}/V_{load}-1)$$

At block 250, the electronic processor 102 determines a current budget ($I_{budget}$) for the battery 106 based on the impedance ($R_{bat}$), a minimum operating voltage ($V_{min}$) for the portable electronic device, and a maximum allowable current draw from the battery ($I_{rated\_max}$) using the following equation:

$$I_{budget}=\min(I_{rated\_max},[V_{unloaded}-V_{min}]/R_{bat})$$

At block 252, the electronic processor 102 adjusts an operating parameter of the portable electronic device based on the current budget. For example, the electronic processor 102 adjusts operating parameters to reduce the loading of the portable electronic device ($R_{Radio}$) to confine the maximum current draw to less than the current budget. For example, the electronic processor 102 may adjust one or more of a transmit abort threshold (how long a transceiver will transmit before shutting down a transmission), a transmit inhibit threshold (at what point transmission will be prevented from starting), an audio peak current for a loudspeaker, a processor operating mode (for example, a low power mode), and a radio status (for example, disabling one or more radios of the application processing subsystem 112).

Figure 3:
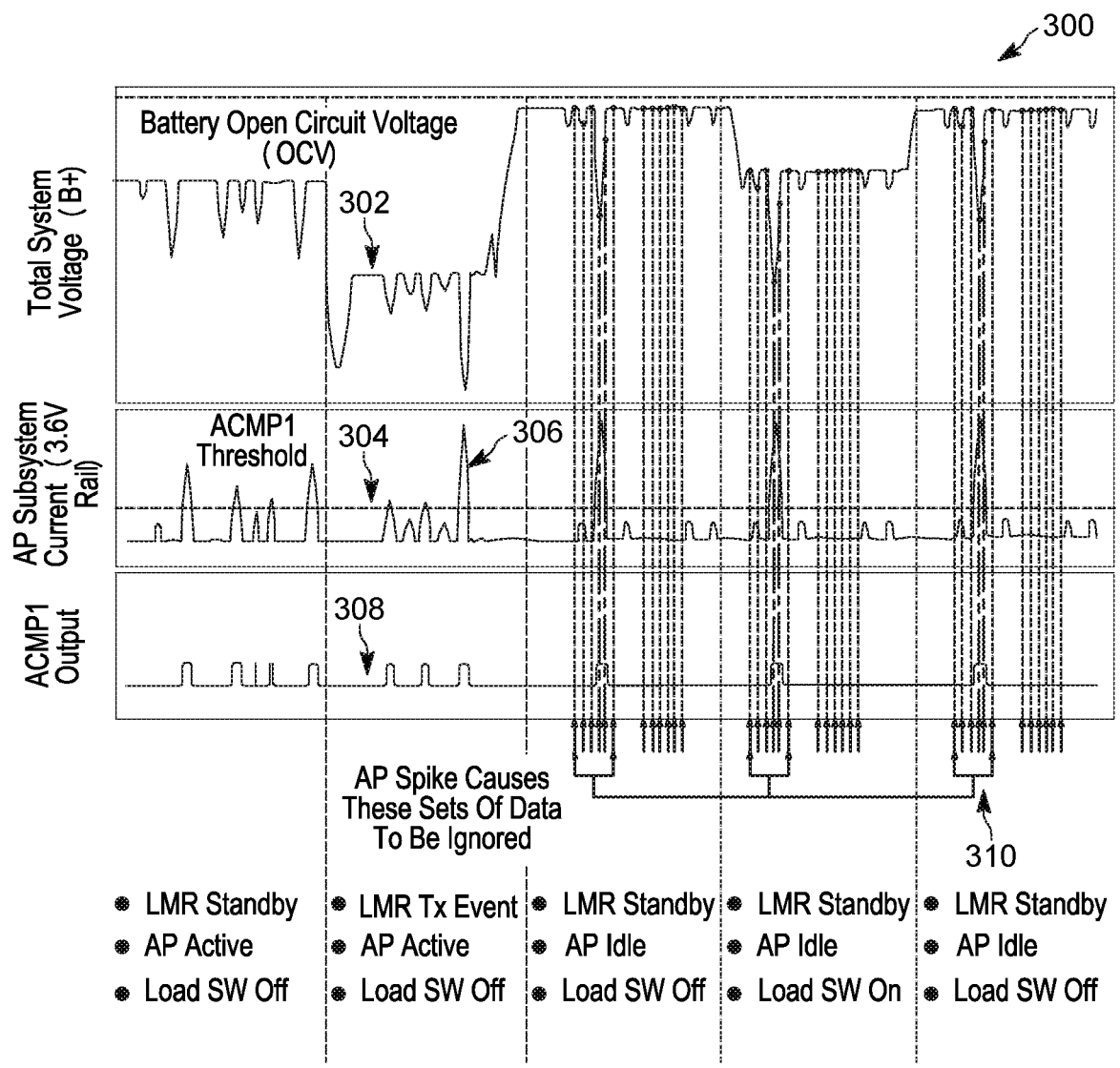
FIG. 3 is a chart illustrating the operation of the portable electronic device of FIG. 1, in accordance with some embodiments.

FIG. 3 is a chart 300, which illustrates the operation of the portable electronic device 100 according to the method 200. Line 302 shows the voltage (B+) for the battery 106 while the land mobile radio subsystem 110 and the application processing subsystem 112 operate in various states. Line 304 shows the current for the application processing subsystem 112, compared to the threshold for a high current level (shown as line 306). Line 308 shows the output of the comparator 128 in response to the current of the application processing subsystem 112. A series of voltage measurements 310 are taken with the switchable load 118 both on and off. As illustrated in FIG. 3, when the comparator output indicates a high current condition on the application processing subsystem 112, the data collected during the high current conditions are ignored.

FIG. 4 illustrates a chart 400, which shows voltage measurements taken without using the output of the comparator 128 to check the current level of the application processing subsystem 112, and a chart 402, with shows voltage measurements taken using the output of the comparator 128 to check the current level of the application processing subsystem 112. Each chart compares measurements taken with the voltage sensor 114 to measurements taken using bench equipment. As illustrated in FIG. 4, using the method 200 results in a measurement error of between −1% and +5%, while measurements taken without using the method 200 result in a measurement error of between −53% and +15%.

Figure 5A:
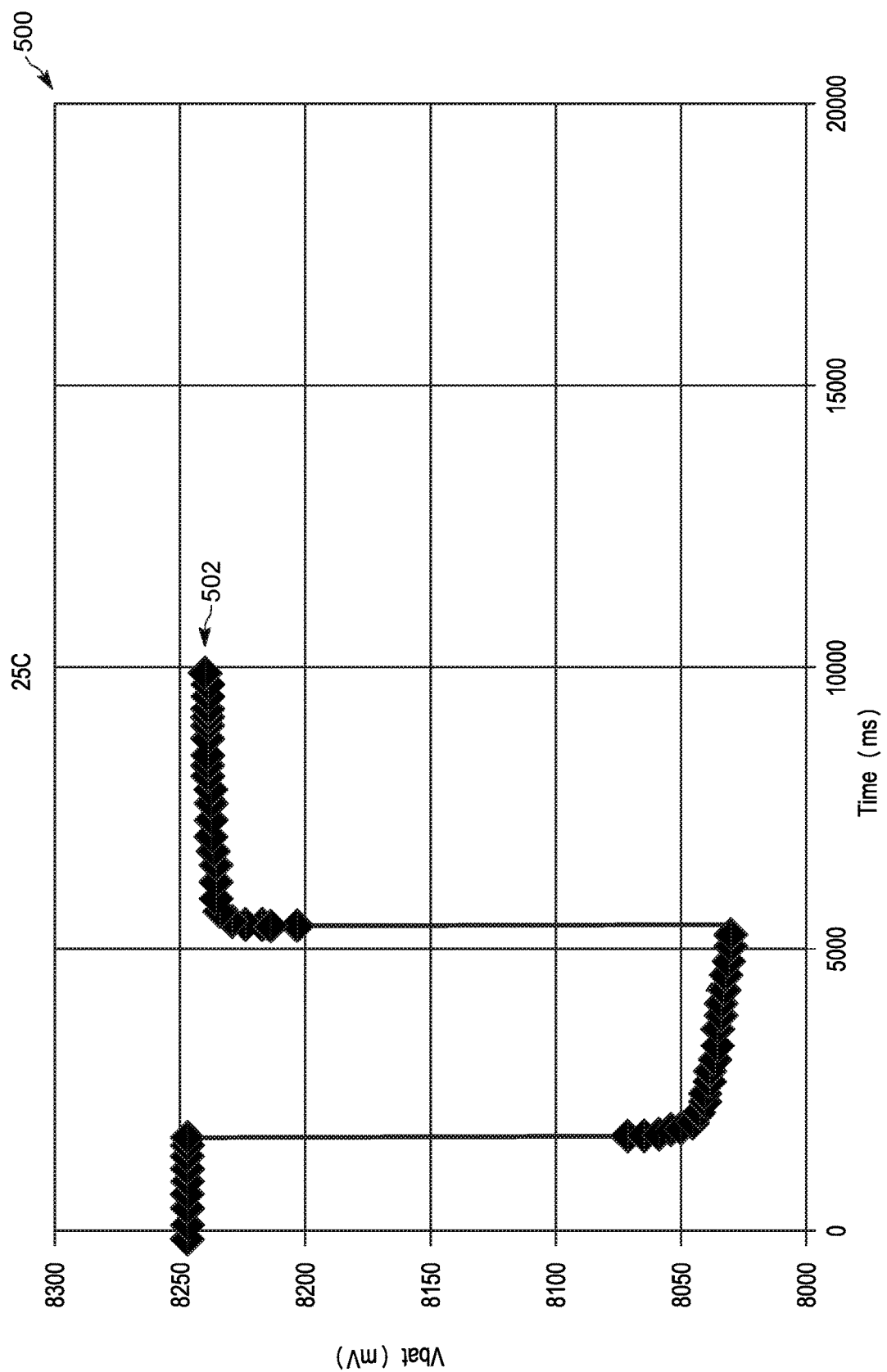
FIGS. 5A-5B present charts illustrating unloaded battery voltage measurements showing a voltage drop and rise before, during, and after a transmit event, in accordance with some embodiments.

FIG. 5A illustrates a chart 500, showing voltage measurements for a voltage drop and rise before, during, and after a transmit event (represented by the line 502), taken while the device operates at an ambient temperature of 25 degrees Celsius. As illustrated in the chart 500, the battery voltage takes some period of time to reach a steady state after a transmit event. Voltage measurements taken prior to the steady state do not provide accurate information regarding the unloaded battery voltage, resulting in false determinations of battery impedance, as noted herein. To calculate a more accurate battery impedance, the unloaded voltage measurement after a transmit event should be taken after the voltage has reached steady state.

Figure 5B:
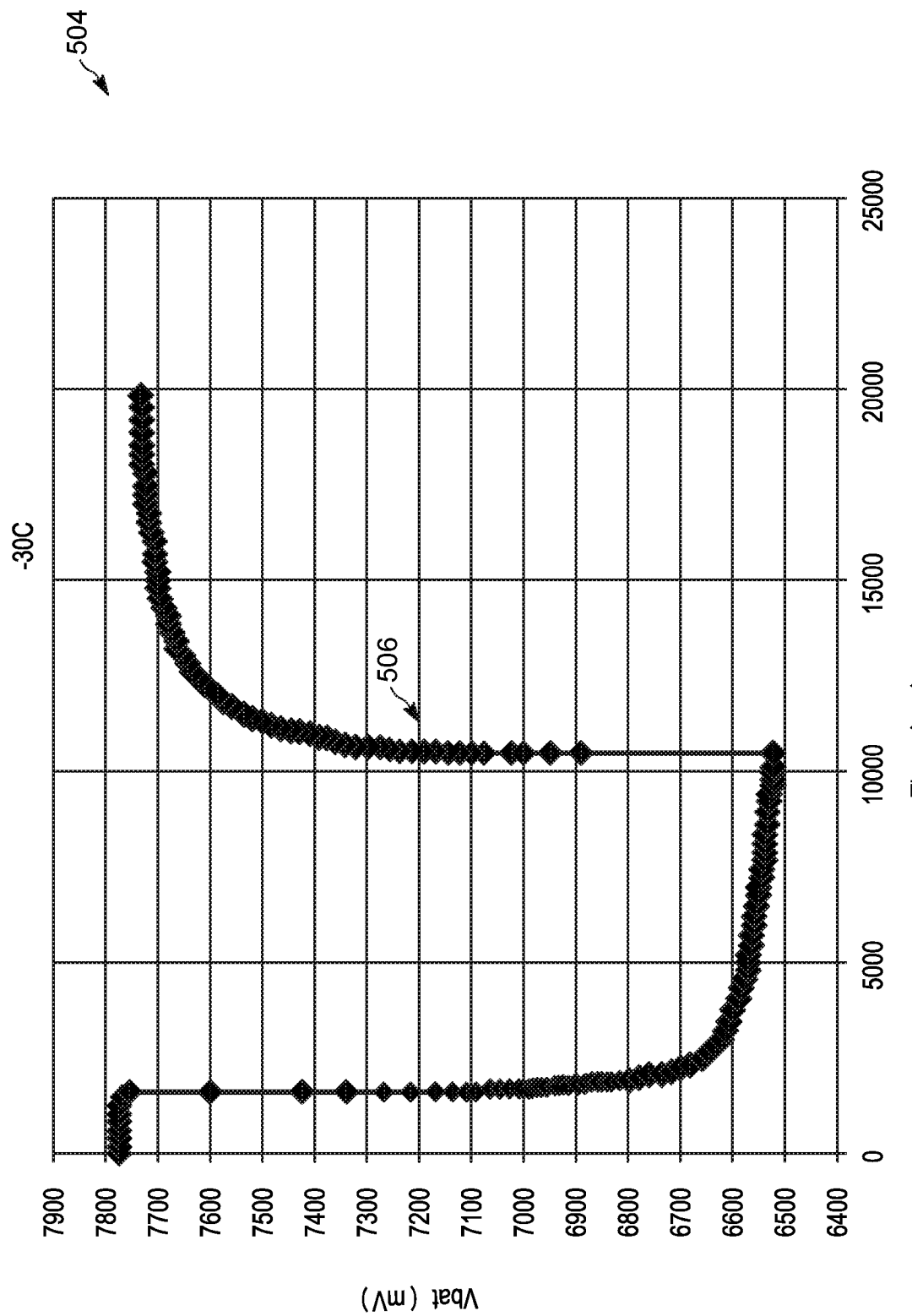

In addition, as ambient temperatures lower, battery chemistry changes the rate at which its voltage drops and rises dependent on load magnitude and duration. For example, FIG. 5B illustrates a chart 504, showing voltage measurements for a voltage drop and rise before, during, and after a transmit event (represented by the line 506), taken while the device operates at an ambient temperature of −30 degrees Celsius. As shown in charts 500 and 504, the battery voltage takes longer to reach steady state after a transmit event at −30 degrees Celsius than at 25 degrees Celsius. As a consequence, when the portable electronic device 100 is operated outdoors in colder climes, this may result in a lower battery impedance calculation than what the device would actually experience during a constant (non-instantaneous) high current draw event. Lower battery impedance calculations may result in incorrect voltage measurements or in a device reset, when inadequate current mitigation actions are taken.

Figure 6A:
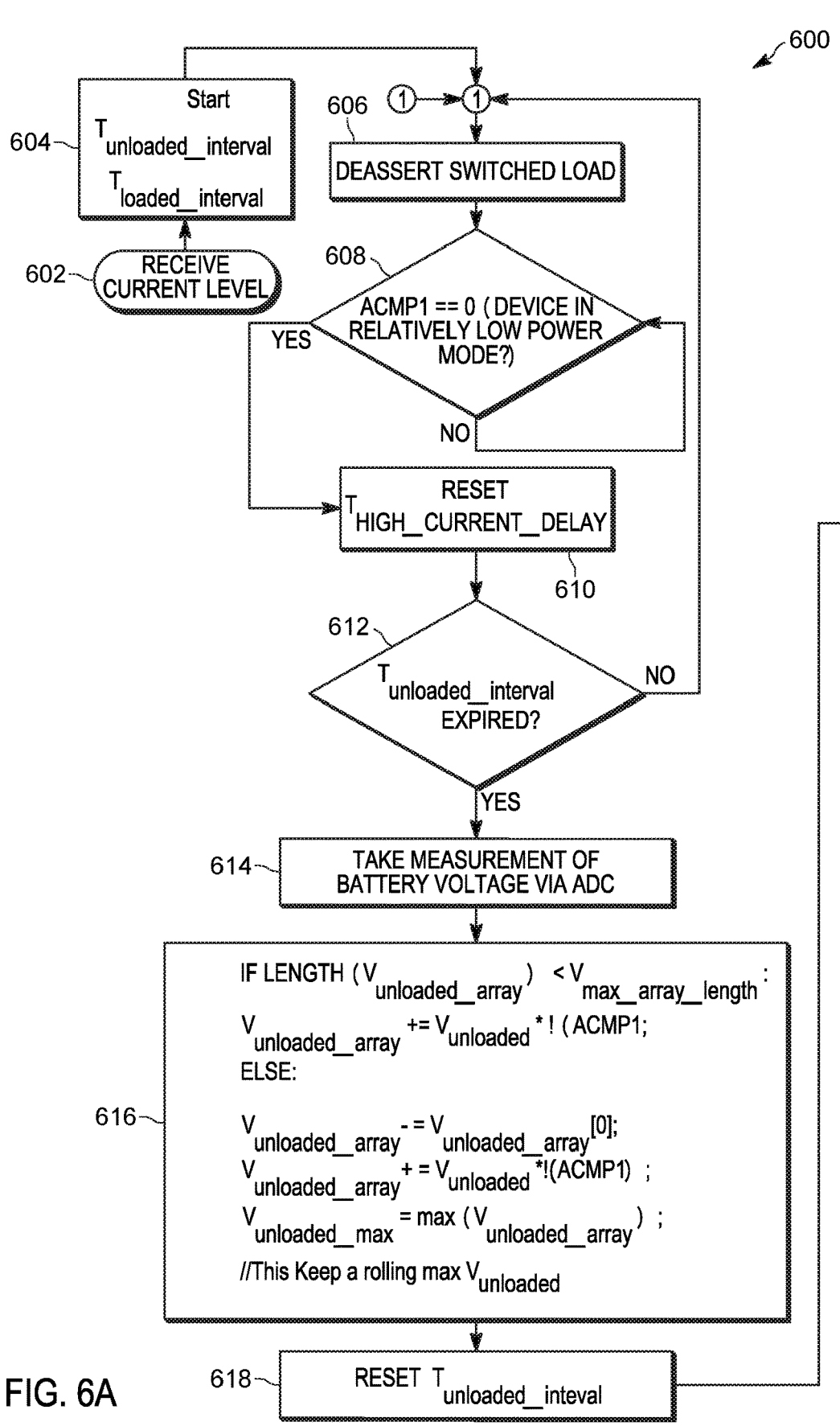
FIGS. 6A-6B illustrate a flowchart of a method for determining available current for a battery in the portable electronic device of FIG. 1, in accordance with some embodiments.
Figure 6B:
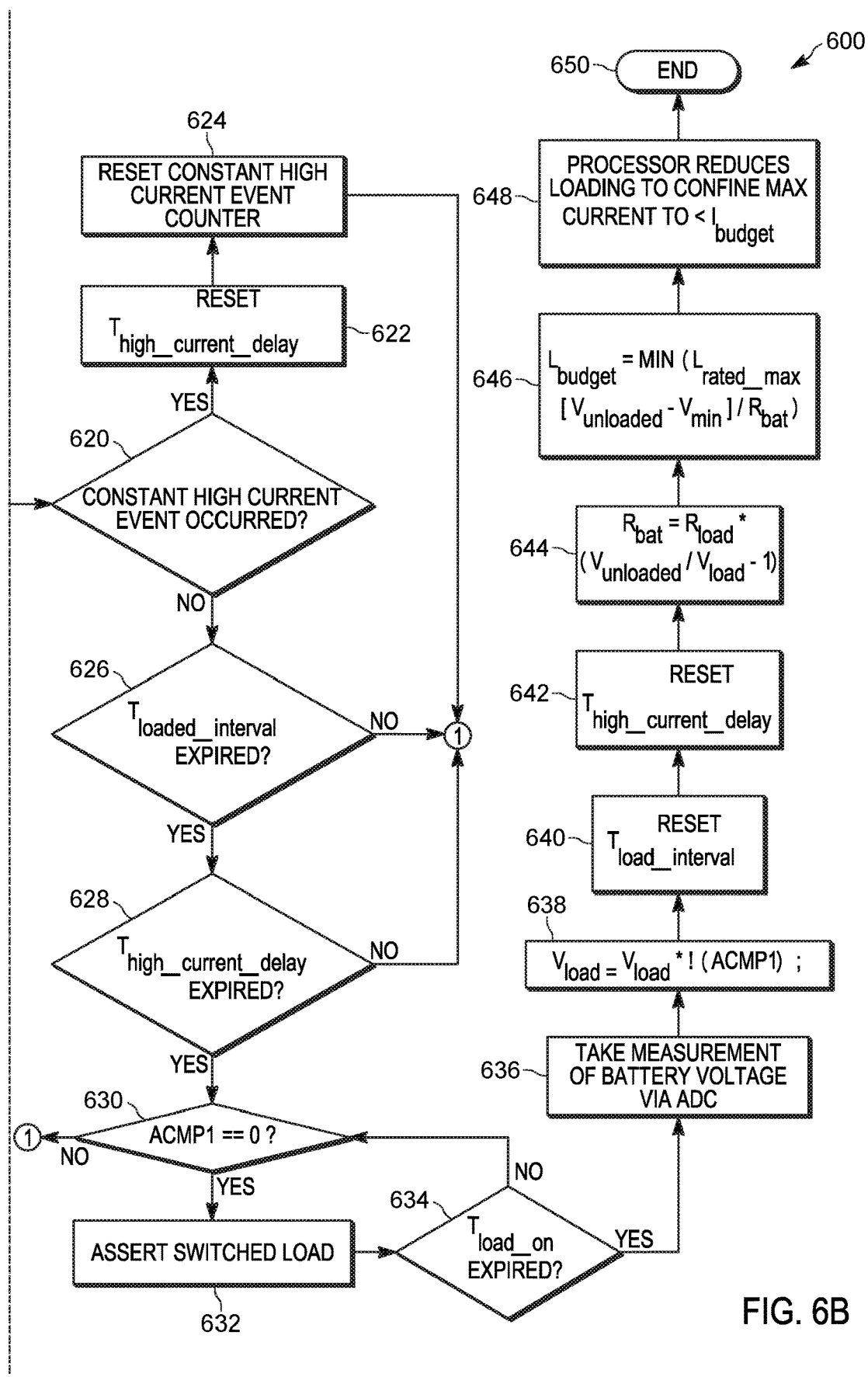

FIGS. 6A and 6B illustrate an example method 600 for determining available current for the battery 106. As an example, the method 600 is described as being performed by the portable electronic device 100 and, in particular, the electronic processor 102.

At block 602, the electronic processor 102 receives, from the current sensor 116, a current level for the auxiliary supply rail 123, for example, as described herein with respect to the method 200. The current level signal is represented as ACMP1 in FIGS. 6A and 6B. As noted herein, ACMP1 is the output signal of the comparator 128.

In some embodiments, the electronic processor initializes (at block 604) timers, including an unloaded voltage interval timer ($T_{unloaded\_interval}$) and a loaded voltage interval timer ($T_{loaded\_interval}$). The unloaded voltage interval timer is used to track how much time has expired since an unloaded voltage was last measured. The loaded voltage interval timer is used to track how much time has expired since a loaded voltage was last measured. As described more particularly below, the timers are used to set the intervals at which the electronic processor 102 takes voltage measurements. The intervals are set based on the operating characteristics of the portable electronic device 100. For example, a heavily used device draws current more quickly. As a consequence, longer measurement intervals may lead to artificially high current budgets because the available current of the battery is drawn down between measurements. The higher the current draw, the faster the voltage drops, and the lower the interval should be and vice versa. In some embodiments, the unloaded voltage interval is two minutes and the loaded voltage interval is twenty minutes. The loaded voltage interval is larger than the unloaded voltage interval because measuring the loaded voltage requires activating the switchable load 118, which draws current. Doing this too often will adversely affect battery life.

In some embodiments, at block 606, the electronic processor 102 deactivates the switchable load 118, for example, by deasserting a gate voltage to a field effect transistor.

In some embodiments, in response to determining that the received current level is equal to or below a predetermined threshold (for example, 500 ms) (at block 608), the electronic processor 102 resets a high current event delay timer ($T_{high\_current\_delay}$). As described more particularly below, the high current event delay timer is used to track the amount of time that has passed since a high current event (for example, an LMR transmission) has occurred. This is based on the characteristics of the battery and the current draw of the higher current events. The longer the battery voltage takes to stabilize after a higher current event, the longer this delay should to be (for example, as illustrated in FIG. 5A).

At block 612, the electronic processor 102 determines whether the unloaded voltage interval timer has expired (for example, but comparing the elapsed time to a threshold value for the interval). When the unloaded voltage interval timer has not expired, the electronic processor 102 continues at block 606. In response to determining that an unloaded voltage interval timer has expired (at block 612), the electronic processor 102 acquires, from the voltage sensor, an unloaded voltage measurement ($V_{unloaded}$) for the battery (at block 614). In some embodiments, the electronic processor 102 acquires an average unloaded voltage measurement, as described herein with respect to the method 200. In some embodiments, the voltage sensor 114 is configured to periodically take voltage measurements, keep a rolling average, and provide the average unloaded voltage measurement to the electronic processor 102 when requested.

At block 616, the electronic processor determines a maximum unloaded voltage measurement ($V_{unloaded\_max}$) for the battery based on the unloaded voltage measurement and a plurality of unloaded voltage measurements. In some embodiments, the electronic processor 102 uses an array ($V_{unloaded\_array}$) of unloaded voltage measurements to determine a rolling maximum unloaded voltage measurement. For example, in some embodiments, the plurality of unloaded voltage measurements is stored (for example, in memory 104) in an array having a maximum length ($V_{max\_array\_length}$). In such embodiments, the electronic processor 102 receives the unloaded voltage measurement (at block 614), and stores the measurement in the array. Prior to storing a new measurement, the electronic processor 102 determines whether the current length of the array is equal to the maximum length (that is, whether or not the array is full). In some embodiments, $V_{max\_array\_length}$ is set to sixty. In some embodiments, the maximum length is based on the rate of current draw of the portable electronic device 100 and the rate of voltage drop of the battery due to this current draw. The higher the rate of voltage drop, the lower $V_{max\_array\_length}$ should be. This may be determined based on available system resources because reading data occupies processor and data buses. The larger the array is, the more accurate measurement will be. If unloaded voltage is measured too frequently, it could adversely impact system performance.

When the array is full, the electronic processor 102 drops the oldest unloaded voltage measurement from the array and adds the new unloaded voltage measurement to the array. When the array is not full, the electronic processor 102 adds the new unloaded voltage measurement to the array. The electronic processor 102 determines the maximum unloaded voltage by selecting the unloaded voltage measurement having the highest value from the unloaded voltage measurements in the array.

At block 618, because an unloaded voltage has been measured, the electronic processor resets the unloaded voltage interval timer.

In some embodiments, the electronic processor 102 determines whether a high current event has occurred (e.g., by checking a constant high current event counter, which is incremented when a high current event is triggered). When a high current event has occurred, the electronic processor 102 resets the high current event delay timer (at block 622) and the constant high current event counter (at block 624), and continues at block 606.

When a high current event has not occurred (at block 620), the electronic processor determines whether the loaded voltage interval timer (at block 626) and the high current event delay timer (at block 628) have expired. When either timer has expired, the electronic processor 102 continues at block 606. As illustrated in FIGS. 6A and 6B, the electronic processor 102 is either continuously or periodically monitoring the current level signal (ACMP1) (for example, at block 630). When the current level signal indicates low current, the electronic processor 102 continues executing the method 600. When the current level signal indicates a high current on the auxiliary supply rail 123, the electronic processor 102 continues at block 606. Alternatively, or in addition, the electronic processor 102 uses the value of ACMP1 as a multiplier when setting the unloaded and loaded voltage values (for example, at blocks 616 and 638).

While the current level signal indicates a low current on the auxiliary supply rail 123, and in response to determining that both the high current event delay timer and the loaded voltage interval timer have expired, the electronic processor 102 activates the switchable load (for example, by applying a gate voltage to a field effect transistor) and begins a switchable load activation timer ($T_{load\_on}$) (at block 632). The switchable load activation timer tracks the time that passes after the switchable load is activated. At block 634, the electronic processor 102 determines whether the switchable load activation timer has expired. When the timer has not expired, the electronic processor 102 continues to check the current level and assert the switchable load, while waiting for the timer to expire (at blocks 630-634). In some embodiments, the switchable load activation timer is 500 ms. This is based on the characteristics of the battery and the current draw of $R_{load}$. The longer the battery voltage takes to stabilize after $R_{load}$ is enabled, the longer this delay should be.

At block 636, in response to determining that the switchable load activation timer has expired, the electronic processor 102 acquires, from the voltage sensor, a loaded voltage measurement for the battery (for example, as described herein with respect to the method 200).

At block 644, the electronic processor 102 calculates an impedance for the battery based on the unloaded voltage, the loaded voltage, and an impedance for the switchable load, as described herein with respect to the method 200.

At block 646, the electronic processor 102 determines a current budget for the battery based on the impedance, a minimum operating voltage, and a maximum allowable current draw from the battery, as described herein with respect to the method 200.

At block 648, the electronic processor 102 adjusts an operating parameter of the portable electronic device based on the current budget, as described herein with respect to the method 200.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 20%, in another embodiment within 10%, in another embodiment within 2% and in another embodiment within 1%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A system for determining available current for a battery in a portable electronic device, the system comprising:
   an auxiliary supply rail coupled to the battery;
   a switchable load coupled between the battery and a ground;
   a current sensor configured to sense a current level of the auxiliary supply rail;
   a voltage sensor configured to measure a voltage of the battery; and
   an electronic processor coupled to the switchable load, the current sensor, and the voltage sensor,
   wherein the electronic processor is configured to
      receive, from the current sensor, the current level; and
      in response to determining that the received current level is equal to or below a predetermined threshold:
         acquire, from the voltage sensor, a plurality of unloaded voltage measurements for the battery;
         calculate, based on the plurality of unloaded voltage measurements, an unloaded voltage;
         activate the switchable load;
         acquire, from the voltage sensor, a plurality of loaded voltage measurements for the battery;
         calculate, based on the plurality of loaded voltage measurements, a loaded voltage;
         calculate an impedance for the battery based on the unloaded voltage, the loaded voltage, and an impedance for the switchable load;
         determine a current budget for the battery based on the impedance, a minimum operating voltage, and a maximum allowable current draw from the battery; and adjust an operating parameter of the portable electronic device based on the current budget.

2. The system for determining available current for a battery in a portable electronic device of claim 1, wherein the electronic processor is further configured to:
in response to determining that the current level is equal to or below the predetermined threshold, initialize an unloaded voltage counter; and
acquire a plurality of unloaded voltage measurements by:
a) determining whether the current level is above the predetermined threshold;
b) when the current level is not above the predetermined threshold,
taking an unloaded voltage measurement,
incrementing the unloaded voltage counter, and
adding the unloaded voltage measurement to an unloaded voltage sum; and
c) repeating steps a and b until the unloaded voltage counter is equal to a desired quantity.

3. The system for determining available current for a battery in a portable electronic device of claim 2, wherein the electronic processor is configured to, when the current level is above the predetermined threshold, discard the unloaded voltage measurement.

4. The system for determining available current for a battery in a portable electronic device of claim 1, wherein the electronic processor is further configured to:
in response to determining that the current level is equal to or below the predetermined threshold, initialize a loaded voltage counter; and
acquire a plurality of loaded voltage measurements by:
a) determining whether the current level is above the predetermined threshold;
b) when the current level is not above the predetermined threshold,
taking a loaded voltage measurement,
incrementing the loaded voltage counter, and
adding the loaded voltage measurement to a loaded voltage sum; and
c) repeating steps a and b until the loaded voltage counter is equal to a desired quantity.

5. The system for determining available current for a battery in a portable electronic device of claim 4, wherein the electronic processor is configured to, when the current level is above the predetermined threshold, discard the loaded voltage measurement.

6. The system for determining available current for a battery in a portable electronic device of claim 1, further comprising:
a digital-to-analog converter coupled to the electronic processor;
wherein the auxiliary supply rail includes a current sensing resistor;
wherein the current sensor includes an amplifier coupled to the current sensing resistor and an analog comparator coupled to the amplifier and the digital-to-analog converter;
wherein the amplifier is configured to provide an amplified voltage to the analog comparator;
wherein the electronic processor is configured to control the digital-to-analog converter to provide a reference voltage to the analog comparator; and
wherein the analog comparator is configured to output a low current level signal when the amplified voltage is less than the reference voltage.

7. The system for determining available current for a battery in a portable electronic device of claim 1, wherein the electronic processor is further configured to:
determine a first standard deviation for the plurality of unloaded voltage measurements;
when the first standard deviation exceeds a first threshold, discard the plurality of unloaded voltage measurements;
determine a second standard deviation for the plurality of loaded voltage measurements; and
when the second standard deviation exceeds a second threshold, discard the plurality of loaded voltage measurements.

8. The system for determining available current for a battery in a portable electronic device of claim 1, wherein the electronic processor is further configured to:
determine whether a time period between calculating the unloaded voltage and calculating the loaded voltage exceeds a correlation threshold; and
when the time period exceeds the correlation threshold, discard the unloaded voltage and the loaded voltage.

9. The system for determining available current for a battery in a portable electronic device of claim 1, wherein
the switchable load includes a load power resistor and a field effect transistor; and
the electronic processor is configured to activate the switchable load by applying a gate voltage to the field effect transistor, causing the field effect transistor to couple the battery to the ground via the load power resistor.

10. The system for determining available current for a battery in a portable electronic device of claim 1, wherein the voltage sensor is an analog-to-digital converter.

11. The system for determining available current for a battery in a portable electronic device of claim 1, wherein the electronic processor is configured to adjust an operating parameter for the portable electronic device by adjusting at least one selected from the group consisting of a transmit abort threshold, a transmit inhibit threshold, an audio peak current, a processor operating mode, and a radio status.

12. A method for determining available current for a battery in a portable electronic device, the method comprising:
receiving, from a current sensor, a current level of an auxiliary supply rail; and
in response to determining that the received current level is equal to or below a predetermined threshold:
acquiring, from a voltage sensor configured to measure a voltage of the battery, a plurality of unloaded voltage measurements for the battery;
calculating, with an electronic processor, an unloaded voltage based on the plurality of unloaded voltage measurements;
activating, with the electronic processor, a switchable load coupled between the battery and a ground;
acquiring, from the voltage sensor, a plurality of loaded voltage measurements for the battery;
calculating, with the electronic processor, a loaded voltage based on the plurality of loaded voltage measurements;
calculating, with the electronic processor, an impedance for the battery based on the unloaded voltage, the loaded voltage, and an impedance for the switchable load;

determining a current budget for the battery based on the impedance, a minimum operating voltage, and a maximum allowable current draw from the battery; and adjusting an operating parameter of the portable electronic device based on the current budget.

13. The method for determining available current for a battery in a portable electronic device of claim 12, further comprising:

in response to determining that the current level is equal to or below the predetermined threshold, initializing an unloaded voltage counter;

wherein acquiring a plurality of unloaded voltage measurements includes:
   a) taking an unloaded voltage measurement;
   b) determining whether the current level is above the predetermined threshold;
   c) when the current level is not above the predetermined threshold,
      incrementing the unloaded voltage counter, and
      adding the unloaded voltage measurement to an unloaded voltage sum; and
   d) repeating steps a-c until the unloaded voltage counter is equal to a desired quantity.

14. The method for determining available current for a battery in a portable electronic device of claim 13, further comprising:

when the current level is above the predetermined threshold, discard the unloaded voltage measurement.

15. The method for determining available current for a battery in a portable electronic device of claim 12, further comprising:

in response to determining that the current level is equal to or below the predetermined threshold, initializing a loaded voltage counter;

wherein acquiring a plurality of loaded voltage measurements includes:
   a) taking a loaded voltage measurement;
   b) determining whether the current level is above the predetermined threshold;
   c) when the current level is not above the predetermined threshold,
      incrementing the loaded voltage counter, and
      adding the loaded voltage measurement to a loaded voltage sum; and
   d) repeating steps a-c until the loaded voltage counter is equal to a desired quantity.

16. The method for determining available current for a battery in a portable electronic device of claim 15, further comprising:

when the current level is above the predetermined threshold, discard the loaded voltage measurement.

17. The method for determining available current for a battery in a portable electronic device of claim 12, further comprising:

controlling, with the electronic processor, a digital-to-analog converter to provide a reference voltage to an analog comparator;

providing an amplified voltage to the analog comparator with an amplifier coupled to a current sensing resistor of the auxiliary supply rail; and outputting, with the analog comparator, a low current level signal when the amplified voltage is less than the reference voltage.

18. The method for determining available current for a battery in a portable electronic device of claim 12, further comprising:

determining a first standard deviation for the plurality of unloaded voltage measurements;

when the first standard deviation exceeds a first threshold, discarding the plurality of unloaded voltage measurements determining a second standard deviation for the plurality of loaded voltage measurements; and when the second standard deviation exceeds a second threshold, discarding the plurality of loaded voltage measurements.

19. The method for determining available current for a battery in a portable electronic device of claim 12, further comprising:

determining whether a time period between calculating the unloaded voltage and calculating the loaded voltage exceeds a correlation threshold; and when the time period exceeds the correlation threshold, discarding the unloaded voltage and the loaded voltage.

20. The method for determining available current for a battery in a portable electronic device of claim 12, wherein adjusting an operating parameter for the portable electronic device includes adjusting at least one selected from the group consisting of a transmit abort threshold, a transmit inhibit threshold, an audio peak current, a processor operating mode, and a radio status.

21. A system for determining available current for a battery in a portable electronic device, the system comprising:

an auxiliary supply rail coupled to the battery;

a switchable load coupled between the battery and a ground;

a current sensor configured to sense a current level of the auxiliary supply rail;

a voltage sensor configured to measure a voltage of the battery; and an electronic processor coupled to the switchable load, the current sensor, and the voltage sensor, wherein the electronic processor is configured to
   receive, from the current sensor, the current level; and
   in response to determining that the received current level is equal to or below a predetermined threshold:
      in response to determining that an unloaded voltage interval timer has expired, acquire, from the voltage sensor, a unloaded voltage measurement for the battery;
      determine a maximum unloaded voltage measurement for the battery based on the unloaded voltage measurement and a plurality of unloaded voltage measurements;
      in response to determining that a high current event delay timer and a loaded voltage interval timer have expired, activate the switchable load and begin a switchable load activation timer;
      in response to determining that the switchable load activation timer has expired, acquire, from the voltage sensor, a loaded voltage measurement for the battery;
      calculate an impedance for the battery based on the unloaded voltage, the loaded voltage, and an impedance for the switchable load;
      determine a current budget for the battery based on the impedance, a minimum operating voltage, and a maximum allowable current draw from the battery; and
      adjust an operating parameter of the portable electronic device based on the current budget.

22. The system for determining available current for a battery in a portable electronic device of claim 21, wherein
the plurality of unloaded voltage measurements is stored in an array having a maximum length; and
the electronic processor is configured to determine a maximum unloaded voltage measurement for the battery by:
in response to determining that a current length for the array is equal to the maximum length, dropping the oldest of the plurality of unloaded voltage measurements from the array and adding the unloaded voltage measurement to the array; and
selecting the unloaded voltage measurement having the highest value of the unloaded voltage measurements in the array.

23. A method for determining available current for a battery in a portable electronic device, the system comprising:
receiving, from a current sensor, a current level of an auxiliary supply rail; and
in response to determining that the received current level is equal to or below a predetermined threshold:
in response to determining that an unloaded voltage interval timer has expired, acquiring, from a voltage sensor configured to measure a voltage of the battery, a unloaded voltage measurement for the battery;
determining a maximum unloaded voltage measurement for the battery based on the unloaded voltage measurement and a plurality of unloaded voltage measurements;
in response to determining that a high current event delay timer and a loaded voltage interval timer have expired, activating a switchable load coupled between the battery and a ground and beginning a switchable load activation timer;
in response to determining that the switchable load activation timer has expired, acquiring, from the voltage sensor, a loaded voltage measurement for the battery;
calculating an impedance for the battery based on the unloaded voltage, the loaded voltage, and an impedance for the switchable load;
determining a current budget for the battery based on the impedance, a minimum operating voltage, and a maximum allowable current draw from the battery; and
adjusting an operating parameter of the portable electronic device based on the current budget.

* * * * *